(12) United States Patent
Grässle

(10) Patent No.: US 6,239,659 B1
(45) Date of Patent: May 29, 2001

(54) LOW POWER GAIN CONTROLLED AMPLIFIER WITH HIGH DYNAMIC RANGE

(75) Inventor: Jürgen Grässle, Tübingen (DE)

(73) Assignee: Sony International (Europe) GmbH, Cologne (DE)

( * ) Notice: Subject to any disclaimer, the term of this patent is extended or adjusted under 35 U.S.C. 154(b) by 0 days.

(21) Appl. No.: 09/124,800

(22) Filed: Jul. 29, 1998

(30) Foreign Application Priority Data

Aug. 1, 1997 (EP) .................................................. 97113325

(51) Int. Cl.$^7$ ...................................................... H03G 3/12
(52) U.S. Cl. ............................................ 330/282; 330/285
(58) Field of Search ............................ 330/282, 86, 285, 330/279, 138, 140

(56) References Cited

U.S. PATENT DOCUMENTS

| | | | |
|---|---|---|---|
| 3,098,199 | * 7/1963 | Carney et al. | 330/29 |
| 3,162,818 | * 12/1964 | Murphy | 328/169 |
| 3,723,894 | * 3/1973 | Benenati | 330/29 |
| 4,114,105 | * 9/1978 | Duncan | 325/480 |
| 4,275,361 | * 6/1981 | Schurmann | 330/277 |
| 5,355,096 | 10/1994 | Kobayashi | 330/278 |
| 5,546,050 | 8/1996 | Florian et al. | 330/282 |
| 5,646,573 | 7/1997 | Bayruns et al. | 330/59 |

FOREIGN PATENT DOCUMENTS 0 734 118 A1    9/1996    (EP) .

OTHER PUBLICATIONS

Kobayashi, K.W. et al: "Monolithic GAAS HBT P–I–N Diode Variable Gain Amplifiers, Attenuators, and Switches" IEEE Transactions on Microwave Theory and Techniques, vol. 41, No. 12, Dec. 1, 1993, pp. 2295–2302, XP000426147.

Kobayashi, K. W. et al: "A Novel Monolithic HBT–P–I–N–HEMT Integrated Circuit with HBT Active Feedback and P–I–N Diode Variable Gain Control" IEEE Transactions on Microwave Theory and Techniques, vol. 43, No. 5, May 1, 1995, pp. 1004–1009, XP000502058.

G. W. Short, The D. C. Feedback Pair, Wireless World p. 637, Dec. 1961.*

* cited by examiner

*Primary Examiner*—Robert Pascal
*Assistant Examiner*—Henry Choe
(74) *Attorney, Agent, or Firm*—Frommer Lawrence & Haug, LLP.; William S. Frommer; Dexter T. Chang

(57) ABSTRACT

A gain-controlled amplifier with a high dynamic range, useful in particular for frequencies in the GHz range, according to the invention comprises a bipolar or FET transistor (1) with an adaptive controlled feedback network (2) which may consist of one or a plurality of series connected diode(s) preferably PIN-diode(s). The transistor (1) and the controlling network (2, 3) can be operated at low voltages and current levels. Even for an operating frequency of 1 GHz and above, a gain control range of more than 20 dB can be obtained. Due to the feedback structure the linearity is enhanced especially for low gain values, and the controlled feedback does not degrade the noise figure. If used in an AGC loop circuit, the circuit current is increased for high input levels. Therefore the proposed circuit is suitable for battery powered receivers having input stages with automatic gain control.

6 Claims, 4 Drawing Sheets

LOW POWER GAIN CONTROLLED AMPLIFIER WITH HIGH DYNAMIC RANGE

FIELD OF THE INVENTION

The invention relates to a gain-controlled RF signal amplifier circuit according the the preamble of claim 1 particularly useful for high frequencies up to the range of microwave frequencies.

BACKGROUND OF THE INVENTION

Conventional gain-controlled amplifiers of the above mentioned general type have at least one of the following drawbacks, i.e.

they require high supply power and are thus not suitable for battery powered units;

they are not suitable for high operating frequencies;

the signal handling capability in particular in respect to linearity is degraded if the gain is reduced; and/or such amplifiers exhibit poor noise figures.

The objects of the invention are to eliminate such problems and to provide a gain-controlled RF signal amplifier suitable for high operating frequencies in the GHz range with good operating linearity, in particular if the gain is reduced, having low noise figure and low power consumption.

These objects are solved according to the invention by a gain-controlled RF signal amplifier provided with an adaptively controlled feedback network according to the characterizing part of claim 1.

Advantageous amendments, improvements and/or embodiments of the subject matter of claim 1 are defined by dependent claims, are described in the following part of this specification and/or are within the scope of the skill of the average expert after having educated himself/herself by reading the present disclosure of the invention.

Variable gain RF amplifiers with more or less linear gain control are known in the art, e.g. in a certain configuration using a dual-gate FET wherein the second gate is used for gain control.

EP-A2-0 601 888 discloses a gain-controlled RF amplifier using a PIN-diode in a series feedback circuit. A similar structure for a gain-controlled RF amplifier using a PIN-diode as a load altering resistance is the subject matter of U.S. Pat. No. 4,275,362. U.S. Pat. No. 4,057,765 describes a variable gain RF input amplifier in which the first 10 dB of a signal attenuation are effected by an AGC voltage applied to the amplification transistor followed by a supplementary attenuation by an increasing reverse bias applied to a PIN-diode in the signal input path to the amplification transistor. The PIN-diode in this circuit is only used as a direct regulation means for higher attenuation values.

Other examples of gain-controlled RF signal amplifiers, more remote from the invention, are the subject matters of U.S. Pat. No. 4,147,991 and U.S. Pat. No. 4,019,160.

SUMMARY OF THE INVENTION

With the invention, the following problems are eliminated: Due to the adaptively controlled feedback network, preferably used in connection with a bipolar transistor or a FET in common emitter or source reference potential connection, respectively, the transistor and the controlling network can be operated at low voltage and current levels, e.g. 3 V and 2 mA. Even for operating frequencies of 1 GHz and above a gain control range of more than 20 dB can be obtained. Due to the novel feedback structure, the linearity is enhanced especially for low gain values. The controlled feedback does not degrade the noise figure. If used in an AGC loop, for example in the entrance part of a digital audio broadcast (DAB) receiver, the circuit current is increased for high input levels. Therefore, the proposed circuit is particularly suitable for battery powered receiver input stages with gain control.

Since the amplifying transistor is preferably operated in grounded emitter configuration (grounded source configuration for a FET), the highest maximum gain with low noise figure is achievable.

Different from gain control circuits described in the above prior art documents, according to the invention a DC-coupled parallel feedback circuit is used. This allows for high-frequency operation and improves the linearity for reduced gain settings. For reduced gain, the current through the amplifier transistor is increased. This further increases the input signal handling capability and the linearity of the amplifier.

An advantageous and satisfyingly tested embodiment of a gain-controlled RF signal amplifier circuit with features according to the invention is subsequently described with reference to the accompanying drawings. However, this description of the embodiment is not to be understood as limitation to the inventive concept, the scope of which is defined as the subject matter of claim 1 including equivalent circuit designs thereof and advantageous improvements thereof.

BRIEF DESCRIPTION OF THE FIGURES

Throughout the following description, the same reference signs are used for the same elements or components of essentially the same function.

DETAILED DESCRIPTION

Figure 1:
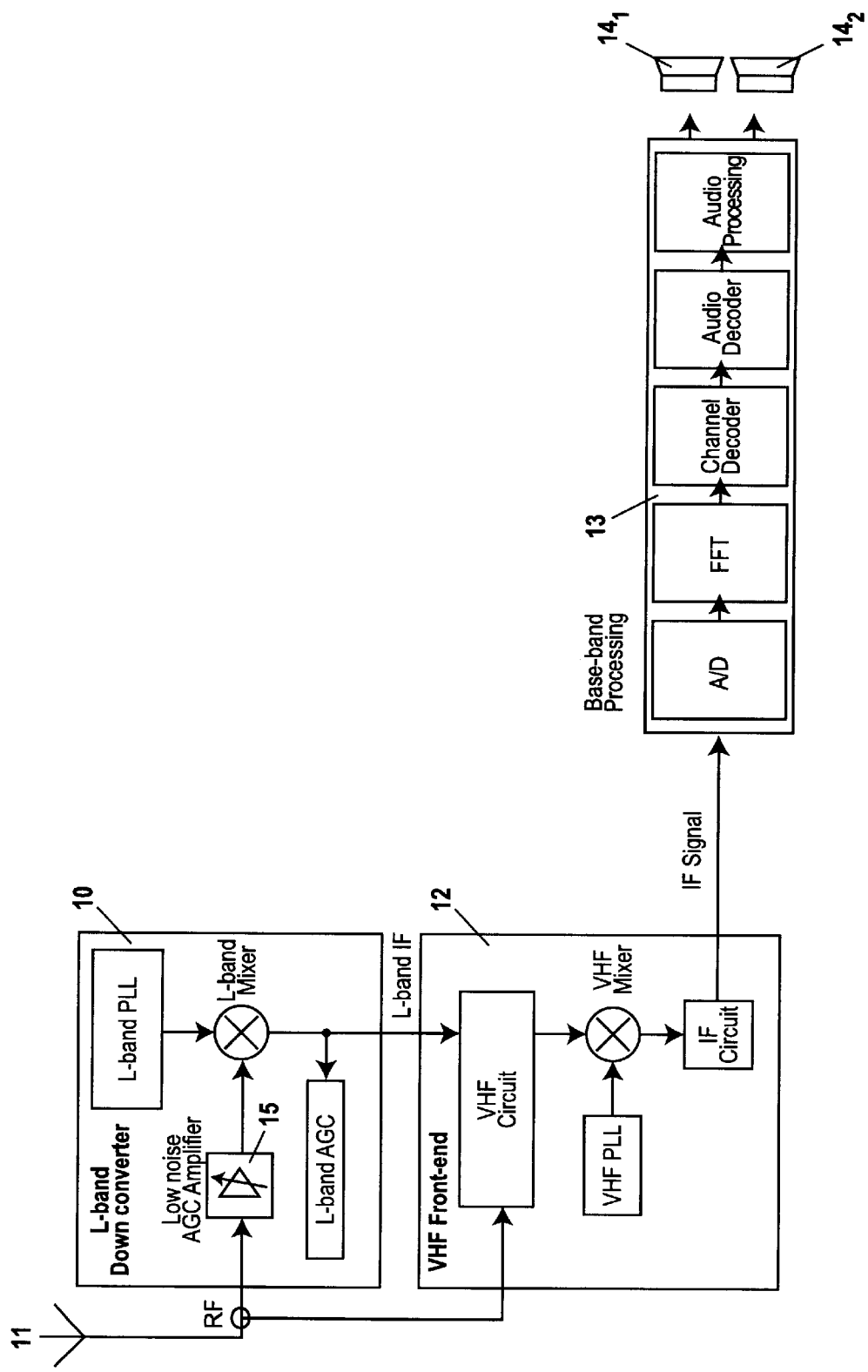
FIG. 1 shows an application example for a gain control RF signal amplifier according to the invention embodied as part of a DAB receiver.

The DAB receiver of FIG. 1 comprises a L-band IF down converter 10, a VHF front-end component 12 and a baseband processing circuit 13 supplying stereo output signals to a pair of speakers $14_1$, $14_2$. As directly shown in the circuit diagram of FIG. 1, the L-band down converter 10 is essentially composed by a L-band mixer supplied by a L-band PLL circuit on the one hand and by a low noise AGC amplifier 15 according to the invention supplied at its input with a RF receiving signal from an antenna 11, on the other hand. The gain-controlled input signal to the AGC amplifier 15 is controlled via a L-band AGC circuit receiving the output signal of the L-band mixer that is also fed to the VHF front-end component 12.

The VHF front-end component 12 comprises a VHF selection and amplification circuit to which the RF signal from antenna 11 is supplied as well as the L-band IF signal from the L-band down converter 10. Controlled by a VHF PLL circuit, a VHF mixer down converts the output signal of the VHF circuit. The following IF circuit performs additional filtering, amplifying and optionally down-conversion and delivers an IF signal to the base-band processing circuit 13 comprising an A/D converter for the IF signal followed by a fast forward Fourier transformation circuit FFT, a channel decoder, an audio decoder and an audio signal processing circuit in a principally known configuration.

The invention is concerned with the low noise AGC amplifier 15 and will be described by an embodiment in further details with reference to FIGS. 2 to 4.

Figure 2:
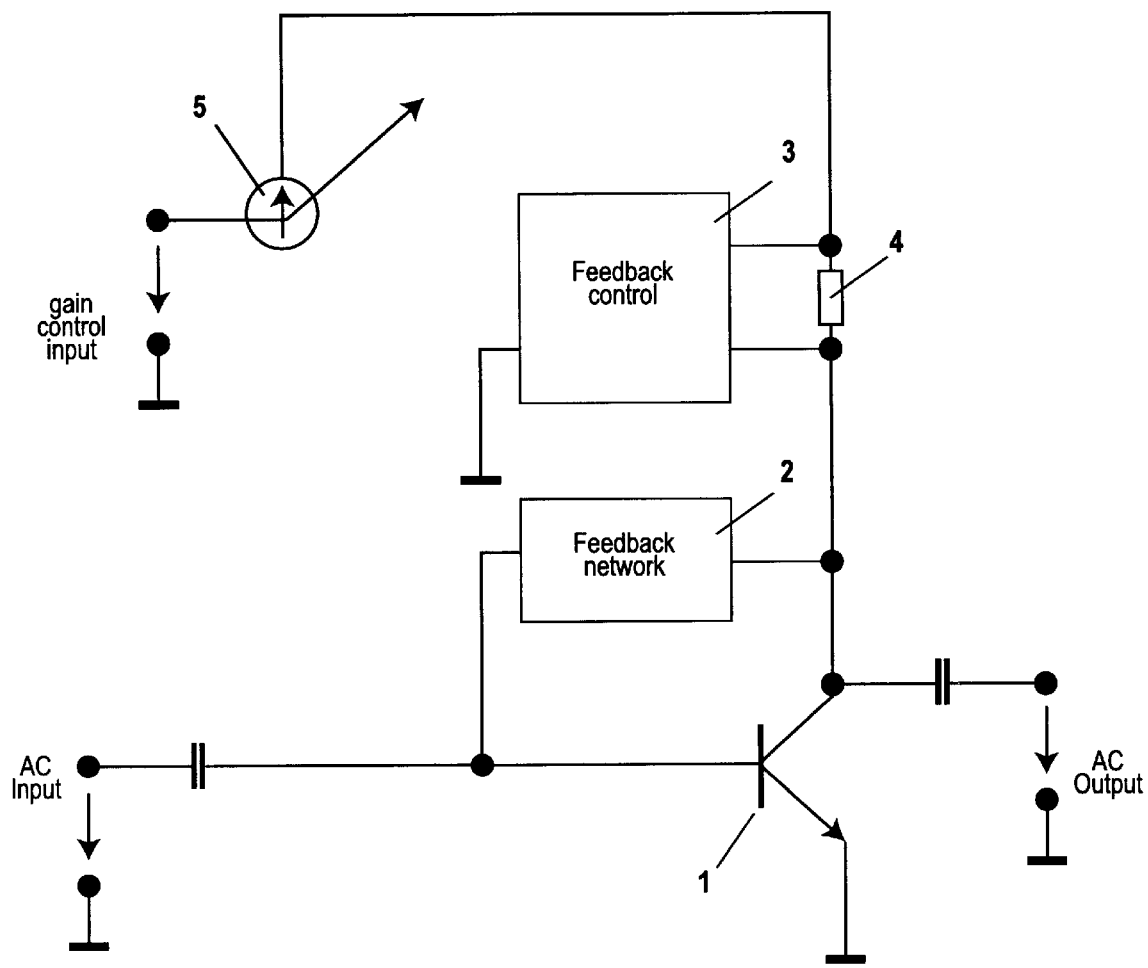
FIG. 2 depicts the basic structure of a gain-controlled RF amplifier according to the invention.

The basic structure of a gain-controlled RF signal amplifier according to the invention is shown In FIG. 2. This circuit comprises the following blocks:

- a bipolar or FET transistor 1; the circuit is shown with a commonly used NPN transistor type, but can of course also be used for PNP (or P channel FET) transistors;
- a controlled feedback network 2 connected between the base (or gate for a FET) and the collector (or drain for a FET); this feedback network 2 is controlled via a DC signal and acts as feedback path for the AC operation of transistor 1;
- a feedback control circuit 3 which is connected across a DC load resistor 4 and feeds to the feedback network 2;
- a DC load resistor 4 which serves to derive the control signal; for AC operation, this resistor can be extended with other passive or active elements or devices; and
- a controlled power supply 5 to provide the DC power for the feedback control circuit 3; this power supply 5 can be a controlled current source or a controlled voltage source or anything in between.

The AC gain of the amplifier circuit with transistor 1 is controlled by altering the DC power within a certain operating range. Within this operating range, increasing the DC power will decrease the AC gain, and decreasing the DC power will increase the AC gain. For AC operation, the power supply 5 is usually bypassed with a capacitor.

To improve the AC performance for high frequency operation, impedance matching networks are recommended but are not shown. Such matching or transformation networks have to be designed to fit the desired operation environment but are not a part of the invention.

Figure 3:
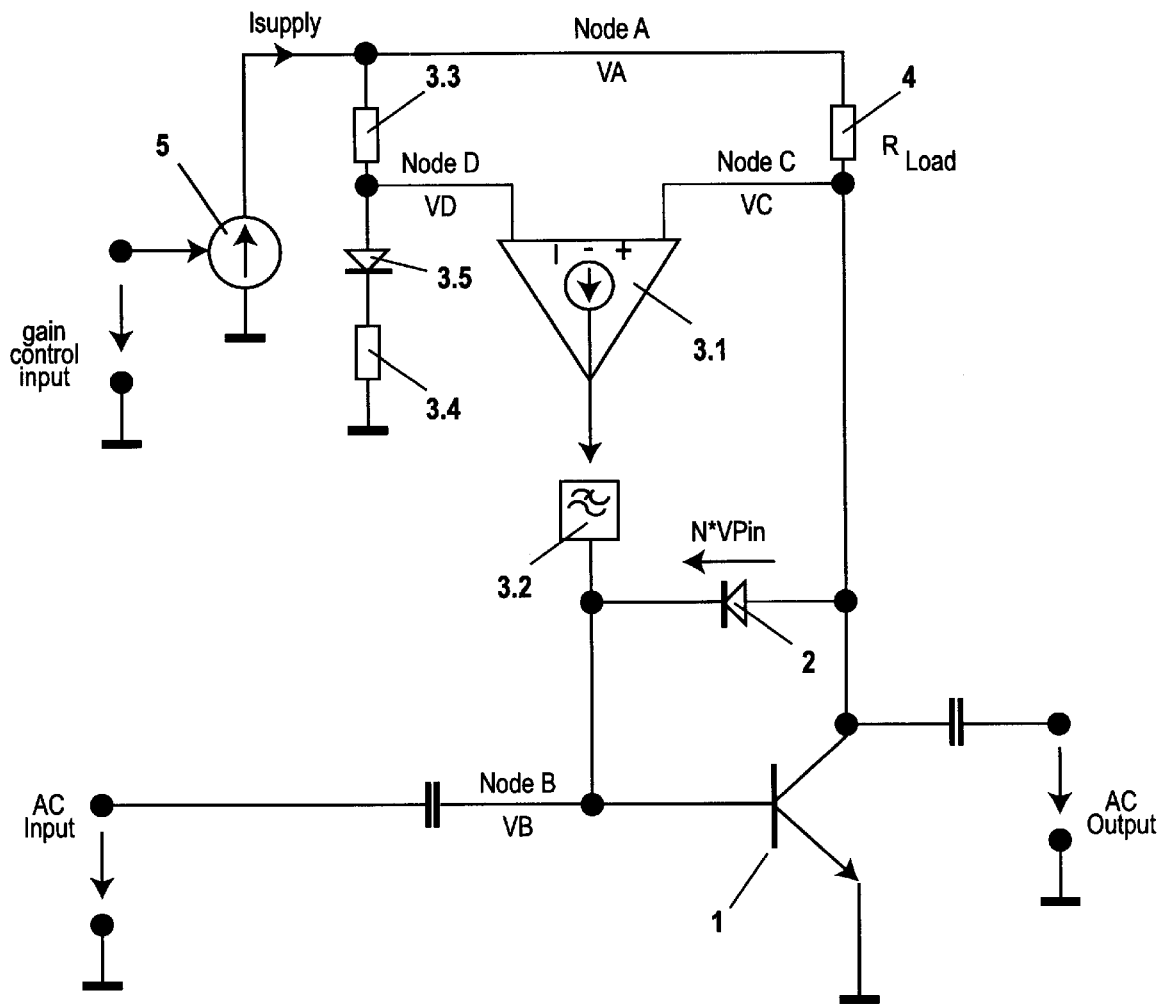
FIG. 3 exemplifies the block diagram of a gain-controlled RF amplifier with features according to the invention, the impedance matching elements for AC operation not being shown.
Figure 4:
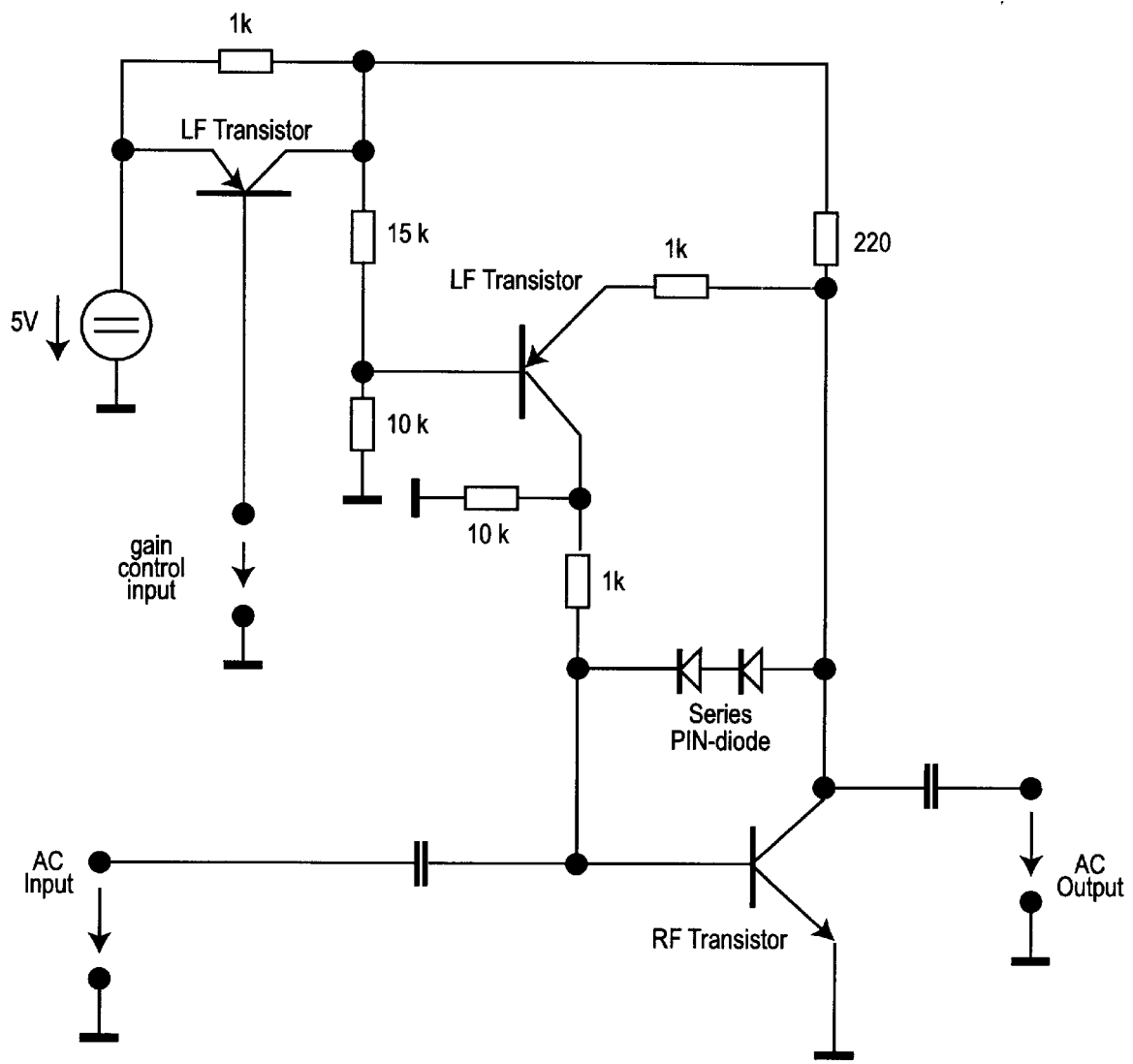
FIG. 4 shows an implementation example for the amplifier circuit according to FIG. 3, again without depicting the circuit elements for AC matching.

The block diagramm of FIG. 3 exemplifies an embodiment for the basic structure of a gain-controlled signal amplifier with features of the invention:

The feedback network connected across the collector base path of transistor 1 in the case of a bipolar transistor (or the drain gate path in the case of a FET) consists of one or more diodes, in particular PIN-diodes connected in series as shown in FIG. 4. The feedback control network 3 consist of a transconductance amplifier 3.1 with differential input and current output connected to a low-pass filter 3.2. The inverting input of differential amplifier 3.1 is connected to a tap node D of a voltage divider network comprising two resistors 3.3 and 3.4 and optionally one or more diodes 3.5. The non-inverting input of differential amplifier 3.1 is connected at node G to an ohmic DC load resistor 4 of which the upper end is connected at node A with the output of the controlled DC power supply 5 which also feeds the voltage divider network 3.3 to 3.5. The lower end of DC load resistor 4 is connected at node C with the anode of a PIN-diode 2 and the collector (drain) of transistor 1.

The working principle of the gain-controlled amplifier circuit of FIG. 3 may be described as follows:

The controlled DC power supply 5 provides the operating DC-current $I_{supply}$ which determines the AC-gain of the amplifier circuit. The operating range of this current $I_{supply}$ is determined by the operating current of transistor 1. At the lower operating range of this DC-current $I_{supply}$, nearly all of this current will flow through transistor 1 and nearly no current will flow through the PIN-diode(s) 2. In this stage, the circuit has maximum gain. If the DC-current $I_{supply}$ is increased, the current through transistor 1 will increase, resulting in a better linearity performance. In addition, the current through the PIN-diode(s) will also increase. This will lower impedance of the PIN-diode(s) 2 tremendous. As a result, the PIN-diode(s) will provide an AC-feedback for transistor 1, which will lower the AC-gain and will further improve the linearity of the circuit. Therefore, higher input signal levels are allowed if the gain is reduced. This is a desired advantageous feature for gain-controlled amplifiers for automatic gain control (AGC).

It is to be noted that no AC-coupling capacity is required, thus the feedback path can consist of only one element or device. This makes the circuit suitable for high frequencies. In addition the whole circuits might be integrated at least as soon as the technology of integrated circuits allows for integrated PIN-diodes.

Some design rules may further help for a full comprehension of the inventive concept.

The bipolar or FET transistor 1 has to be chosen in order to give the desired maximum signal gain under the available power supply conditions. The voltage VPin across each PIN-diode 2 varies between a minimal and maximal value corresponding to the maximum and minimum gain of the circuit, respectively. The number N of PIN-diodes 2 connected in series is determined by the desired operating voltage VC at node C. With VB being the voltage of node B which is the base or gate voltage of transistor 1, it holds true that $$VC = VB + N*VPin$$

The differential amplifier 3.1 forces that the voltage at node C is equal to the voltage at node D, i.e.

$$VC = VD$$

The low-pass filter 3.2 preferably consisting of the inherent frequency response of the differential amplifier 3.1 prevents that the desired AC signal is levelled out. This requires a cut-off frequency well below the lowest operating frequency.

The voltage divider 3.3, 3.4 (eventually including diode 3.5) determines the ratio of the voltage VC at node C to the voltage VA at node A, i.e.

$$VD = \alpha*VA \text{ with } \alpha \in (0,1) \text{ typically } \alpha \approx 0.5$$

The impedance of the voltage divider 3.3 to 3.5 should be low enough to provide the bias current of the differential amplifier 3.1.

To compensate the temperatur drift of the diode(s) 2, one or more diodes can be added in series to resistor 3.4.

The DC load resistor 4 determines the supply current $I_{supply}$ of the circuit for a given voltage VA at node A. If the current through the voltage divider 3.3 to 3.5 is neglected it follows that:

$$I_{supply} = (VC - VA)/RLoad = (\alpha - 1)*VA/RLoad$$

This current mainly flows through transistor 1.

The controlled DC power supply 5 may be a controlled current source, a controlled voltage source or anything in between. A current source will give the lowest temperature drift of the AC gain.

Based on the above design rules, FIG. 4 shows an implementation example which in consideration of the above explanations is self-explanatory for the person skilled in the art.

The essential advantages of the invention may be summarized as follows:

The amplifying transistor 1 should preferably be operated in a reference potential or grounded emitter configuration (source configuration for a FET).

This provides for the highest maximum gain and low noise figure.

The gain control is performed by a DC-coupled parallel feedback bridging the collector emitter path of the amplifying transistor (gate drain path for a FET). This allows for high-frequency operation and improves the linearity for reduced gain settings.

For reduced gain the current through the transistor 1 is increased. This further increases the input signal handling capability and linearity of the amplifier.

Since the power consumption with a gain-controlled signal amplifier according to the invention is considerably reduced in particular for low input signals which is the normal case of operation, the invention is of particular usefulness for all kinds for portable receivers for which handheld telephones (handies), portable TV receivers and DAB receivers may be examples.

What is claimed is:

1. A gain-controlled RF signal amplifier circuit comprising:

a transistor having an AC input for receiving an RF signal, and an AC output for deriving an amplified AC signal;

a gain control circuit for adjusting an AC gain of said transistor according to a gain control input signal; and an adaptively controlled feedback network as part of said gain control circuit connected between the input and the output of said transistor for adaptively controlling the AC gain of said transistor via its operating current in accordance with said gain control input signal and comprising at least one series connected PIN-diode.

2. A gain-controlled RF signal amplifier circuit comprising:

a transistor having an AC input for receiving an RF signal, and an AC output for deriving an amplified AC signal;

a gain control circuit for adjusting an AC gain of said transistor according to a gain control input signal; and an adaptively controlled feedback network as part of said gain control circuit connected between the input and the output of said transistor for adaptively controlling the AC gain of said transistor via its operating current in accordance with said gain control input signal; wherein said feedback network is biased by a feedback control circuit whose input signal is derived via a DC load resistor connected between a controlled DC power supply and the output of said transistor.

3. The amplifier circuit of claim 2 wherein the bias signal for said feedback network is derived via a low-pass filter.

4. The amplifier circuit of claim 2 wherein said DC load resistor is connected to passive elements designed according to a selected RF range of said RF signal amplifier circuit.

5. The amplifier circuit of claim 2 wherein said feedback control circuit comprises a voltage divider network connected between said controlled DC power supply and said common reference potential, a tap node of said divider network being connected to one input of a differential amplifier whose other input is connected to a common connecting node of said DC load resistor and the output of said transistor, the output of said differential amplifier feeding a bias node of said feedback network via said low-pass filter.

6. The amplifier circuit of claim 5 wherein said low-pass filter is defined by the inherent frequency response of said differential amplifier.

* * * * *